United States Patent
Balakrishnan et al.

(10) Patent No.: US 9,472,471 B1
(45) Date of Patent: Oct. 18, 2016

(54) HYBRID ORIENTATION VERTICALLY STACKED III-V AND GE GATE-ALL-AROUND CMOS

(71) Applicant: INTERNATIONAL BUSINESS MACHINES CORPORATION, Armonk, NY (US)

(72) Inventors: Karthik Balakrishnan, Yorktown Heights, NY (US); Pouya Hashemi, Yorktown Heights, NY (US); Sanghoon Lee, Yorktown Heights, NY (US); Alexander Reznicek, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/057,299

(22) Filed: Mar. 1, 2016

(51) Int. Cl.
| | | |
|---|---|---|
| *H01L 21/302* | (2006.01) | |
| *H01L 21/84* | (2006.01) | |
| *H01L 21/308* | (2006.01) | |
| *H01L 21/3105* | (2006.01) | |
| *H01L 21/311* | (2006.01) | |
| *H01L 21/02* | (2006.01) | |
| *H01L 21/8238* | (2006.01) | |
| *H01L 29/423* | (2006.01) | |
| *H01L 29/06* | (2006.01) | |
| *H01L 21/8258* | (2006.01) | |

(52) U.S. Cl.
CPC ....... *H01L 21/845* (2013.01); *H01L 21/02532* (2013.01); *H01L 21/02538* (2013.01); *H01L 21/308* (2013.01); *H01L 21/31055* (2013.01); *H01L 21/31116* (2013.01); *H01L 21/8258* (2013.01); *H01L 21/823821* (2013.01); *H01L 29/0673* (2013.01); *H01L 29/42392* (2013.01)

(58) Field of Classification Search
CPC ........... H01L 29/772; H01L 29/66674; H01L 21/38; H01L 21/385; H01L 21/388; H01L 21/66712; H01L 21/3065; H01L 21/31115; H01L 21/31116; H01L 21/31138; H01L 21/28518
USPC ....... 438/135, 137, 173, 188, 691, 700, 706, 438/717, 722, 735, 736
See application file for complete search history.

(56) References Cited

U.S. PATENT DOCUMENTS

| | | | |
|---|---|---|---|
| 8,900,951 B1 | 12/2014 | Cheng et al. | |
| 8,981,449 B2 * | 3/2015 | Bedell .................. | H01L 29/788 257/314 |
| 2005/0285175 A1 * | 12/2005 | Cheng ............... | H01L 27/10864 257/302 |
| 2014/0103414 A1 * | 4/2014 | Koldiaev .............. | H01L 21/845 257/296 |
| 2015/0287642 A1 * | 10/2015 | Chang ................. | H01L 21/8249 438/236 |

FOREIGN PATENT DOCUMENTS

WO 2013095341 A1 6/2013

OTHER PUBLICATIONS

Karthik Balakrishnan, Pouya Hashemi, Sanghoon Lee, Alexander Reznicek, "Fabrication Method or Hybrid Orientation Vertically Stacked III-V and Ge Gate-All-Around CMOS", Dec. 2, 2015, IP.com No. 000244332.

* cited by examiner

*Primary Examiner* — Lan Vinh
(74) *Attorney, Agent, or Firm* — Shimokaji IP

(57) ABSTRACT

A method of CMOS construction may include stacked III-V nanowires and stacked Ge nanowires. The CMOS construction may include a hybrid orientation with surface SOI and a standard substrate.

1 Claim, 2 Drawing Sheets

PFET CROSS-SECTION
ALONG THE GATE, AFTER
S/D EPI AND ILD FILL

NFET CROSS-SECTION ALONG THE GATE, AFTER S/D EPI AND ILD FILL

PFET CROSS-SECTION ALONG THE GATE, AFTER S/D EPI AND ILD FILL

HYBRID ORIENTATION VERTICALLY STACKED III-V AND GE GATE-ALL-AROUND CMOS

BACKGROUND OF THE INVENTION

The present invention generally relates to a method of creating CMOS. More particularly, the present invention relates to a hybrid stacked nanowire featuring III-V nanowires and Ge.

High mobility III-V and Germanium (Ge) are attractive for 5 nm CMOS in a gate all around structures. For integration of III-V on Silicon (Si) substrate, growth on Si surfaces have shown promise. Growth of Ge can be slow and difficult.

As can be seen, there is a need for a hybrid orientation stacked nanowire featuring III-V nanowires and Ge.

SUMMARY OF THE INVENTION

In one aspect, a method may include providing a hybrid oriented SOI (Silicon-On-Insulator) substrate (HOT substrate); P++doping the SOI; masking a first region of the SOI; etching the SOI, and epitaxially growing the SOI from substrate seed; removing STI (Shallow Trench Isolation) area on the SOI; forming a hardmask on the SOI; forming a fin pattern on the SOI; utilizing CMP (Chemical-mechanical planarization) to process first dielectric removal; revealing recess and fin after material removal; filling and removing a second dielectric utilizing CMP; revealing recess and fin after second dielectric removal; filling and recessing the first and second dielectrics to form a stack of dielectrics; depositing a spacer as a liner over the CMOS structure; forming a sidewall from the spacer; forming and RIE (Reactive Ion Etching) a dielectric stack; blocking a PFET area; stripping a dielectric, Epitaxial III-V growth on sidewalls of the CMOS structure; using RIE to remove unwanted III-V material; blocking a NFET area, strip second dielectric, and epitaxially grow the Ge on a sidewalls of the CMOS structure; removing unwanted Ge using RIE; etching the hardmask (HM) using RIE on the fins; stripping the spacer hardmask; fabricating a FET, create gates and hardmask using CMP; forming spacers, mask nFETs and S/D (Source/drain) pFET epi (epitaxy), mask pFET, and S/D nFET epi (epitaxy), deposit ILD (inter-level dielectric) followed by CMP; stripping the gate and oxide, remove first dielectric to suspend nanowires; and utilizing high-k (HK)/work function (WF) Metal Gate (MG) formation, and MG fill.

These and other features, aspects and advantages of the present invention will become better understood with reference to the following drawings, description and claims.

DETAILED DESCRIPTION OF THE INVENTION

The following detailed description is of the best currently contemplated modes of carrying out exemplary embodiments of the invention. The description is not to be taken in a limiting sense, but is made merely for the purpose of illustrating the general principles of the invention, since the scope of the invention is best defined by the appended claims.

Various inventive features are described below that can each be used independently of one another or in combination with other features.

Broadly, embodiments of the present invention generally provide a method for hybrid stacked nanowire featuring III-V nanowires and Ge nanowires.

Figure 1:
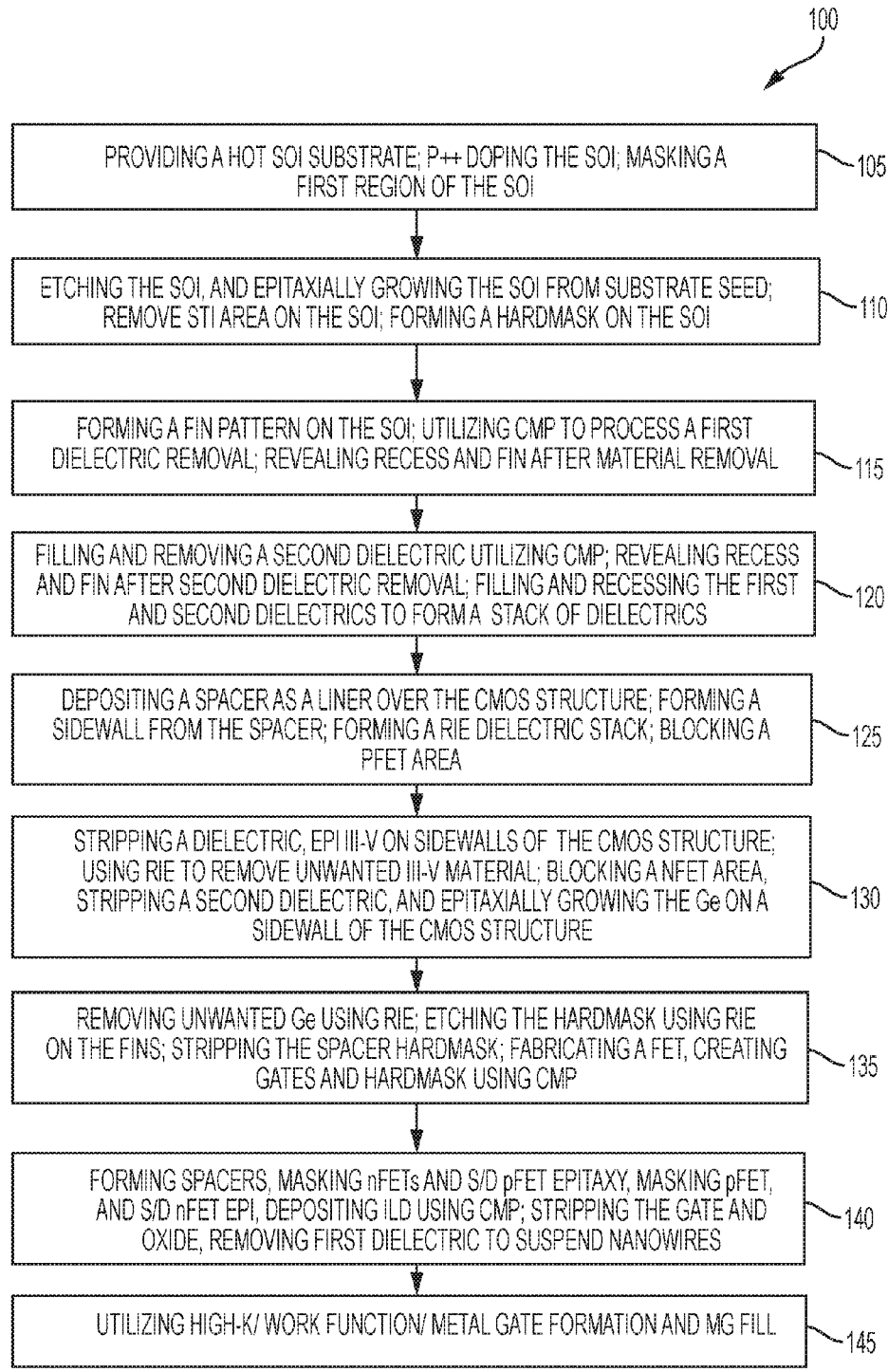
In FIG. 1 illustrates a flow chart for hybrid orientation of vertically stacked II-V and Ge according to an exemplary embodiment of the present invention.

In FIG. 1 a method of forming a CMOS structure, may include a step 105 of providing a hot SOI (Silicon-On-Insulator) substrate (HOT substrate); P++ doping the SOI; masking a first region of the SOI. A step 110 may include etching the SOI, and epitaxially growing the SOI from substrate seed; removing STI (Shallow Trench Isolation) area on the SOI; forming a hardmask on the SOI. A step 115 may include forming a fin pattern on the SOI; utilizing CMP (Chemical-mechanical planarization) to process first dielectric removal; revealing recess and fin after material removal. A step 120 may include filling and removing a second dielectric utilizing CMP; revealing recess and fin after second dielectric removal; filling and recessing the first and second dielectrics to form a stack of dielectrics. A step 125 may include depositing a spacer as a liner over the CMOS structure; forming a sidewall from the spacer; forming and RIE (Reactive Ion Etching) a dielectric stack; blocking a PFET area. A step 130 may include stripping a dielectric, Epitaxial III-V growth on sidewalls of the CMOS structure; using RIE to remove unwanted III-V material; blocking a NFET area, stripping second dielectric, and epitaxially growing the Ge on a sidewall of the CMOS structure; A step 135 may include removing unwanted Ge using RIE; etching the hardmask (HM) using RIE on the fins/mandrel; stripping the spacer hardmask; fabricating a FET, creating gates and hardmask using CMP. A step 140 may include forming spacers, masking nFETs and S/D (Source/drain) pFET epi (epitaxy), mask pFET, and S/D nFET epi (epitaxy), deposit ILD (inter-level dielectric) followed by CMP; stripping the gate and oxide, removing first dielectric to suspend nanowires. A step 145 may include utilizing high-k (HK)/work function (WF) Metal Gate (MG) formation, and MG fill.

Figure 2:
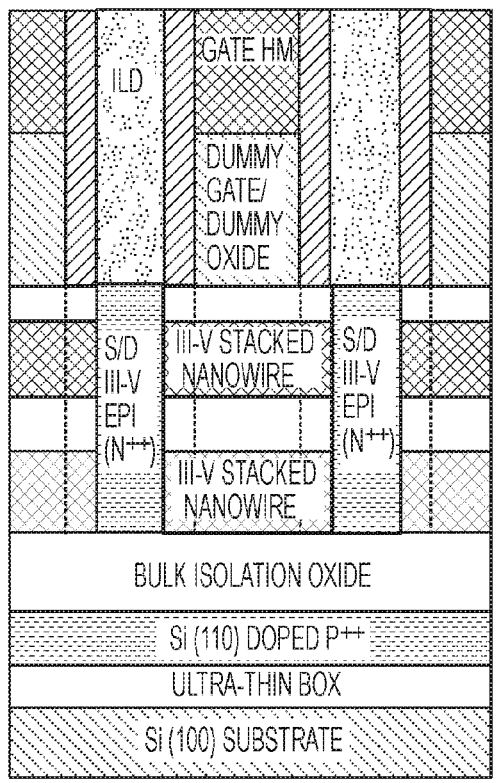
FIG. 2 illustrates a cross-sectional view of an NFET along a gate after S/D (source to drain) epitaxy and ILD fill.
Figure 3:
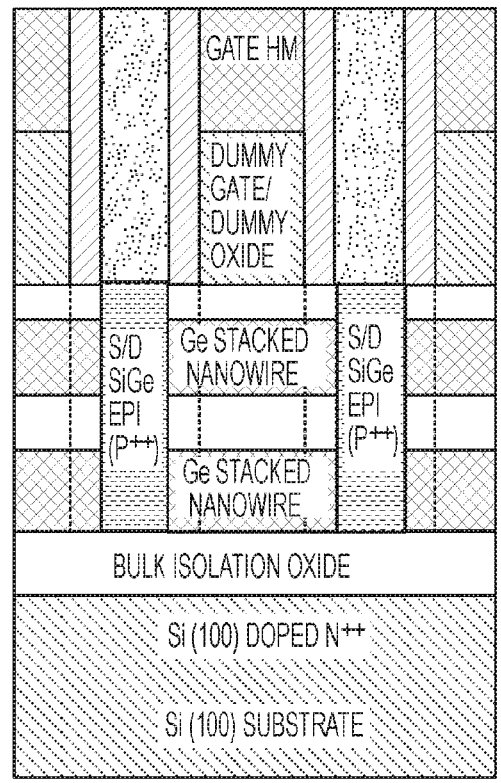
FIG. 3 illustrates a cross-sectional view of a PFET along a gate after S/D epitaxy and ILD (inter-level-dielectric) fill.

FIG. 2 illustrates a cross-sectional view of an NFET along a gate after S/D (source to drain) epitaxy and ILD fill. FIG. 3 illustrates a cross-sectional view of a PFET along a gate after S/D epitaxy and ILD (inter-level-dielectric) fill.

In an embodiment, the method 100 may use a surface SOI and a standard silicon substrate to form a hybrid substrate. The STI (Shallow Trench Isolation) technique, or box isolation technique, may be utilized, for example, between steps 105 and 110. In an embodiment, the fin pattern for step 115 may be created for areas doped N as well as areas doped P.

It should be understood, of course, that the foregoing relates to exemplary embodiments of the invention and that modifications may be made without departing from the spirit and scope of the invention as set forth in the following claims.

What is claimed is:

1. A method of forming a CMOS structure, comprising:
providing a hot SOI substrate;
P++ doping the SOI;
masking a first region of the SOI;
etching the SOI, and epitaxying the SOI from substrate seed;

removing STI area on the SOI;
forming a hardmask on the SOI;
forming a fin pattern on the SOI;
utilizing CMP to process first dielectric removal;
revealing recess and fin after material removal;
filling and removing a second dielectric utilizing CMP;
revealing recess and fin after second dielectric removal;
filling and recessing the first and second dielectrics to form a stack of dielectrics;
depositing a spacer as a liner over the CMOS structure;
forming a sidewall from the spacer;
forming and RIE a dielectric stack;
blocking a PFET area;
stripping a dielectric, Epitaxially growing III-V material on sidewalls of the CMOS structure;
using RIE to remove unwanted III-V material;
blocking a NFET area, strip second dielectric, and epitaxially growing the Ge on a sidewall of the CMOS structure;
removing unwanted Ge using RIE;
etching the hardmask using RIE on the fins;
stripping the spacer hardmask;
fabricating a FET, creating gates and hardmask using CMP;
forming spacers, masking nFETs and S/D pFET epitaxy, masking pFET, and S/D nFET epitaxy, depositing inter-level dielectric followed by CMP;
stripping the gate and oxide, removing first dielectric to suspend nanowires; and
utilizing high-K work function metal gate formation, and metal gate fill.

* * * * *